United States Patent
Engel et al.

(12)

(10) Patent No.: US 6,531,723 B1
(45) Date of Patent: Mar. 11, 2003

(54) MAGNETORESISTANCE RANDOM ACCESS MEMORY FOR IMPROVED SCALABILITY

(75) Inventors: Bradley N. Engel, Chandler, AZ (US); Leonid Savtchenko, deceased, late of Chandler, AZ (US), by Anatoli A. Korkin, legal representative; Jason Allen Janesky, Mesa, AZ (US); Nicholas D. Rizzo, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/978,860

(22) Filed: Oct. 16, 2001

(51) Int. Cl.[7] ............................................. H01L 31/072
(52) U.S. Cl. ....................... 257/200; 365/171; 365/173; 365/158; 257/295
(58) Field of Search .................. 365/158, 171, 365/173; 257/295, 421, 425, 43

(56) References Cited

U.S. PATENT DOCUMENTS 6,205,052 B1 * 3/2001 Slaughter et al. ........... 365/158
6,233,172 B1 * 5/2001 Chen et al. .................. 365/158

* cited by examiner

Primary Examiner—Hoai Ho
Assistant Examiner—Mai-Huong Tran
(74) Attorney, Agent, or Firm—Douglas W. Gilmore; William E. Koch

(57) ABSTRACT

A scalable magnetoresistive tunneling junction memory cell comprising a fixed ferromagnetic region having a magnetic moment vector fixed in a preferred direction in the absence of an applied magnetic field, an electrically insulating material positioned on the fixed ferromagnetic region to form a magnetoresistive tunneling junction, and a free ferromagnetic region having a magnetic moment vector oriented in a position parallel or anti-parallel to that of the fixed ferromagnetic region. The free ferromagnetic region includes N ferromagnetic layers that are anti-ferromagnetically coupled, where N is an integer greater than or equal to two. The number N of ferromagnetic layers can be adjusted to increase the effective magnetic switching volume of the MRAM device.

21 Claims, 1 Drawing Sheet

MAGNETORESISTANCE RANDOM ACCESS MEMORY FOR IMPROVED SCALABILITY

FIELD OF THE INVENTION

This invention relates to semiconductor memory devices.

More particularly, the present invention relates to semiconductor random access memory devices that utilize a magnetic field.

BACKGROUND OF THE INVENTION

Memory devices are an extremely important component in electronic systems. The three most important commercial high-density memory technologies are SRAM, DRAM, and FLASH. Each of these memory devices uses an electronic charge to store information and each has its own advantages. SRAM has fast read and write speeds, but it is volatile and requires large cell area. DRAM has high density, but it is also volatile and requires a refresh of the storage capacitor every few milliseconds. This requirement increases the complexity of the control electronics.

FLASH is the major nonvolatile memory device in use today. Typical non-volatile memory devices use charges trapped in a floating oxide layer to store information. Drawbacks to FLASH include high voltage requirements and slow program and erase times. Also, FLASH memory has a poor write endurance of $10^4$–$10^6$ cycles before memory failure. In addition, to maintain reasonable data retention, the thickness of the gate oxide has to stay above the threshold that allows electron tunneling, thus restricting FLASH's scaling trends.

To overcome these shortcomings, new magnetic memory devices are being evaluated. One such device is magnetoresistive RAM (hereinafter referred to as "MRAM"). MRAM has the potential to have speed performance similar to DRAM. To be commercially viable, however, MRAM must have comparable memory density to current memory technologies, be scalable for future generations, operate at low voltages, have low power consumption, and have competitive read/write speeds.

For an MRAM device, the stability of the memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a cell to be magnetized into either of two possible memory states. Recalling data is accomplished by sensing the electrical resistance, which differs for the two states. The magnetic fields for programming are created by passing currents through conductive lines external to the magnetic structure or through the magnetic structures themselves.

Conventional MRAM devices rely on the bit shape with aspect ratio to create a shape anisotropy that provides the switching field. As the bit dimension shrinks, three problems occur. First, the switching field increases for a given shape and film thickness, requiring more current to switch. Second, the total switching volume is reduced so that the energy barrier for reversal, which is proportional to volume and switching field, is also reduced. The energy barrier refers to the amount of energy needed to switch the magnetic moment vector from one state to the other. The energy barrier determines the data retention and error rate of the MRAM device and unintended reversals can occur due to thermal fluctuations if the barrier is too small. Finally, because the switching field is produced by shape, the switching field becomes more sensitive to shape variations as the bit shrinks in size. With photolithography scaling becoming more difficult at smaller dimensions, MRAM devices will have difficulty maintaining tight switching distributions.

It would be highly advantageous, therefore, to remedy the foregoing and other deficiencies inherent in the prior art.

Accordingly, it is an object of the present invention to provide a new and improved magnetoresistive random access memory device.

It is an object of the present invention to provide a new and improved magnetoresistive random access memory device which can be scaled while keeping the switching field nearly constant.

It is another object of the present invention to provide a new and improved magnetoresistive random access memory device which has a controllable magnetic switching volume.

It is a further object of the present invention to provide a new and improved magnetoresistive random access memory device which has a controllable energy barrier to minimize the bit error rate of the device.

It is an object of the present invention to provide a new and improved magnetoresistive random access memory device which can be fabricated using conventional photolithography processing.

It is another object of the present invention to provide a new and improved magnetoresistive random access memory device which has a switching field that is less dependant on shape.

SUMMARY OF THE INVENTION

To achieve the objects and advantages specified above and others, a scalable magnetoresistive tunneling junction memory (hereinafter referred to as "MRAM") device is disclosed. The MRAM device includes a substrate onto which a fixed magnetic region is positioned. An electrically insulating material of sufficient thickness to act as a electron tunneling barrier is then positioned on the fixed magnetic region and a free magnetic region is positioned on the electrically insulating material. The fixed magnetic region adjacent to the tunneling barrier has a resultant magnetic moment vector that is fixed in a preferred direction.

In the preferred embodiment, the free magnetic region includes a synthetic anti-ferromagnetic (hereinafter referred to as "SAF") layer material. The synthetic anti-ferromagnetic layer material includes N anti-ferromagnetically coupled layers of a ferromagnetic material where N is an integer greater than or equal to two. Further, the N layers define a magnetic switching volume that can be adjusted by changing N. In the preferred embodiment, the N ferromagnetic layers are anti-ferromagnetically coupled by sandwiching an anti-ferromagnetic coupling spacer layer between each adjacent ferromagnetic layer.

In the preferred embodiment, the total net magnetic moment vector is comprised of the vector sum of the each N sub-layer magnetic moment vectors. Because each sub-layer is anti-ferromagnetically coupled to its neighboring layer, there are two antiparallel directions the sub-layer moments can point in zero magnetic field. The total moment is therefore determined by the difference of $M_1$ and $M_2$, where $M_1$ and $M_2$ are the total sub-layer moments in each direction, respectively. The magnetic moment vectors are usually oriented anti-parallel by the coupling of the anti-ferromagnetic coupling spacer layer. Anti-ferromagnetic coupling is also generated by the magnetostatic fields of the layers in the MRAM structure. Therefore, the spacer layer need not necessarily provide any additional antiferromagnetic coupling beyond eliminating the ferromagnetic coupling between the two magnetic layers.

The magnetic moment vectors in the ferromagnetic layers can have different magnitudes to provide a resultant magnetic moment vector given by $\Delta M=(M_2-M_1)$ and a sub-layer magnetic moment fractional balance ratio, $$M_{br} = \frac{(M_2 - M_1)}{(M_2 + M_1)} = \frac{\Delta M}{M_{total}},$$

where $M_{total}=M_1+M_2$ is the total moment of the N layers. The resultant magnetic moment vector of the N-layer structure is free to rotate with an applied magnetic field. In zero field the resultant magnetic moment vector will be stable in a direction, determined by the magnetic anisotropy, which is either parallel or anti-parallel with respect to the resultant magnetic moment vector of the fixed magnetic region.

The current through the MRAM device depends on the tunneling magnetoresistance, which is governed by the relative orientation of the magnetic moment vectors of the free and fixed magnetic regions directly adjacent to the tunneling barrier. If the magnetic moment vectors are parallel, then the MRAM device resistance is low and a voltage bias will induce a larger current through the device. This state is defined as a "1". If the magnetic moment vectors are anti-parallel, then the MRAM device resistance is high and an applied voltage bias will induce a smaller current through the device. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moment vectors in the MRAM device to be orientated either one of parallel and anti-parallel directions relative to the magnetic moment vector in the fixed reference layer.

The number N of ferromagnetic layers can be adjusted to increase the magnetic switching volume of the free magnetic region. By increasing the magnetic switching volume, the energy barrier required to inadvertently reverse the magnetic moment vectors is increased. The effect of the increased energy barrier is to decrease the data retention error rate due to inadvertent reversals caused by thermal fluctuations. Consequently, the stability of the memory state is increased. The addition of ferromagnetic layers can be such that there is no change in the sub-layer magnetic moment balance ratio $M_{br}$ and the switching field remains constant for a circular bit shape. Hence, the total energy barrier is increased since each anti-ferromagnetically coupled ferromagnetic layer must overcome its intrinsic anisotropy to reverse, thereby increasing the magnetic switching volume without increasing the required switching current. Therefore, the MRAM device can be scaled to smaller lateral dimensions and the magnetic switching volume can be kept constant or adjusted to a desired value by adding more anti-ferromagnetically coupled ferromagnetic layers while maintaining a constant sub-layer moment balance ratio.

In the preferred embodiment, the MRAM device is circular in shape so that there is no contribution to the switching field from shape anisotropy. In this configuration, a parameter that predominantly sets a switching field is the material's induced magnetic anisotropy, $H_k$. For typical materials such as NiFeCo, $H_k$ is only about 20 Oe, which is undesirable for MRAM device operation. If a SAF N-layer structure is included in the free region, then the anisotropy and switching field, $H_{sw}$, is amplified depending on the sub-layer magnetic moment fractional balance ratio $M_{br}$ such that:

$$H_{sw} = \frac{(M_2 + M_1)}{(M_2 - M_1)} \cdot H_k = \frac{H_k}{M_{br}},$$

where $M_1$, $M_2$ are the total sub-layer magnetic moments in each direction of the N-layer structure, respectively. The increase in the switching field is a result of the smaller resultant magnetic moment vector becoming a smaller handle for the external magnetic field to rotate all of the spins in the N ferromagnetic layers. Hence, the closer in magnitude that the opposing magnetic moments are to each other, the higher the effective switching field. Thus, the switching field can be adjusted to a reasonable value through the control of the induced $H_k$ and the sub-layer magnetic moment balance ratio $M_{br}$. The shape sensitivity is decreased since the circular shape is not the main source of the switching field. Also, the diminished resultant magnetic moment vector further reduces the effect of shape variations since the effective magnetic charges at the shape edges are much smaller than for a single layer film of comparable thicknes

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
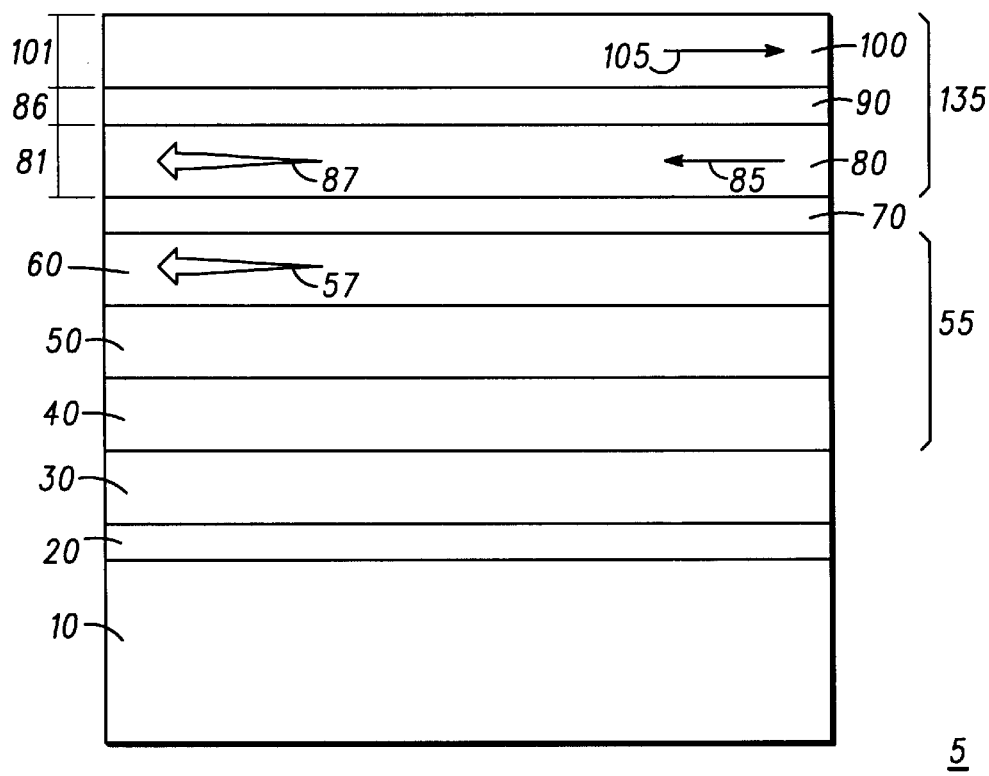
FIG. 1 is a sectional view of a magnetoresistive random access memory device with improved scalability.

Turn now to FIG. 1, which illustrates a simplified sectional view of a scalable magnetoresistive tunneling junction memory cell 5 in accordance with the present invention. The scalable magnetoresistive tunneling junction memory cell 5 includes a supporting substrate 10 onto which a seed layer 20 is positioned. Supporting substrate 10 may be, for example, a semiconductor substrate or wafer and semiconductor control devices may then be formed thereon. Seed layer 20 is formed on supporting substrate 10 to aid in the formation and operation of the remaining layers of material. An anti-ferromagnetic layer 30 is then positioned on seed layer 20 and includes, for example, Ni, Fe, Mn, Co or combinations thereof. It will be understood that seed layer 20 is optional and is included in this preferred embodiment for illustrative purposes. Also, the positioning of anti-ferromagnetic layer 30 is for fabrication convenience with many other possible configurations available.

A first magnetic region 55 having a resultant magnetic moment vector 57 is positioned on the anti-ferromagnetic layer 30. An electrically insulating layer 70 is placed on first magnetic region 55 and a second magnetic region 135 having a resultant magnetic moment vector 87 is positioned on electrically insulating layer 70. Electrically insulating layer 70 behaves as a tunneling barrier junction. It will be understood that electrically insulating layer 70 can include multiple insulating layers, but is shown as one layer for illustrative purposes.

Anti-ferromagnetic layer 30 pins resultant magnetic moment vector 57 unidirectionally along a preferred magnetic axis unless sufficient magnetic field is supplied to overcome the pinning action of layer 30. Generally, anti-ferromagnetic layer 30 is thick enough to insure that spurious signals and normal cell writing signals will not switch resultant magnetic moment vector 57.

In the preferred embodiment, fixed magnetic region 55 includes a synthetic anti-ferromagnetic layer material which includes a tri-layer structure of an anti-ferromagnetic coupling spacer layer 50 sandwiched between a ferromagnetic layer 60 and a ferromagnetic layer 40. However, it will be understood that magnetic region 55 can include a synthetic anti-ferromagnetic layer material other than a tri-layer structure and the use of a tri-layer structure in this embodiment is for illustrative purposes only. Further, magnetic region 55 is a fixed ferromagnetic region, meaning that resultant magnetic moment vector 57 is not free to rotate in the presence of a moderate applied magnetic field and is used as the reference layer.

A free magnetic region 135 includes a synthetic anti-ferromagnetic layer material which includes N ferromagnetic layers that are anti-ferromagnetically coupled, wherein N is a integer number greater than or equal to two. In the embodiment shown here for simplicity, N is chosen to be equal to two so that magnetic region includes a tri-layer structure which has an anti-ferromagnetic coupling spacer layer 90 sandwiched between a ferromagnetic layer 80 and a ferromagnetic layer 100. Ferromagnetic layers 80 and 100 each have thicknesses 81 and 101, respectively. Further, anti-ferromagnetic coupling spacer layer 90 has a thickness 86. It will be understood that the synthetic anti-ferromagnetic layer material in magnetic region 135 can include other structures with a different number of ferromagnetic layers and the use of a tri-layer structure in this embodiment is for illustrative purposes only. For example, a five-layer stack of a ferromagnetic layer/anti-ferromagnetic coupling spacer layer/ferromagnetic layer/anti-ferromagnetic coupling spacer layer/ferromagnetic layer could be used, wherein N is equal to three.

Generally, anti-ferromagnetic coupling spacer layers 50 and 90 include elements Ru, Os, Re, Cr, Rh, and Cu, or combinations thereof. Further, ferromagnetic layers 40, 60, 80, and 100 generally include alloys of Ni, Fe, Mn, Co, or combinations thereof. Ferromagnetic layers 80 and 100 each have a magnetic moment vector 85 and 105, respectively, that are usually held anti-parallel by coupling of anti-ferromagnetic coupling spacer layer 90. Also, magnetic region 135 has a resultant magnetic moment vector 87. Resultant magnetic moment vectors 57 and 87 are oriented along an anisotropy easy-axis in a preferred direction. Further, magnetic region 135 is a free ferromagnetic region, meaning that resultant magnetic moment vector 87 is free to rotate in the presence of an applied magnetic field.

While anti-ferromagnetic coupling layers are illustrated between the ferromagnetic layers in magnetic regions 55 and 135, it will be understood that the ferromagnetic layers could be anti-ferromagnetically coupled through other means such as magnetostatic fields or other features. For example, when the aspect ratio of a cell is reduced to five or less, the ferromagnetic layers are anti-parallel coupled from magnetostatic flux closure. In this case, any nonmagnetic spacer layer that breaks the ferromagnetic exchange between layers will suffice. However, in the preferred embodiment, the adjacent ferromagnetic layers are anti-ferromagnetically coupled by sandwiching anti-ferromagnetic coupling material between each adjacent ferromagnetic layer. One advantage of using a synthetic anti-ferromagnetic layer material is that the anti-parallel coupling of the magnetic moment vectors prevents a vortex from forming at a given thickness where a vortex would be formed if using a single layer.

Further, during fabrication of scalable magnetoresistive tunneling junction memory cell 5, each succeeding layer (i.e. 20, 30, 40, etc.) is deposited or otherwise formed in sequence and each cell may be defined by selective deposition, photolithography processing, etching, etc. in any of the techniques known in the semiconductor industry. During deposition of at least the ferromagnetic layers 80 and 100, a magnetic field is provided to set an easy magnetic axis for these layers (induced anisotropy). This anisotropy axis can also be set subsequent to deposition by annealing in the presence of a magnetic field.

The number N of ferromagnetic layers in free region 135 can be adjusted such that the magnetic switching volume of free region 135 remains substantially constant or increases as the device is scaled laterally to smaller dimensions. Thus, the magnetic switching volume of MRAM device 5 can be controlled and, consequently, the bit error rate can be minimized. Thicknesses 81 and 101 and/or the materials of the layers are chosen so that a magnetic field needed to switch magnetic moments 85 and 105 remains substantially constant (the term "substantially constant" is intended to include moderate increases) as the device is scaled laterally. Because the N ferromagnetic layers can be chosen such that there is no change in the magnetic moment balance ratio $M_{br}$, the switching field $H_{sw}$ remains constant for a circular plan. The total energy barrier for magnetic moment vector reversal increases since each individual ferromagnetic layer must overcome its induced anisotropy to reverse, thereby increasing the effective volume without increasing $H_{sw}$. For a bit shape with aspect ratio greater than one, the volume can be increased while minimizing the increase in switching field by appropriate choice of moment balance in the adjacent ferromagnetic layers.

In an alternate embodiment, magnetoresistive tunneling junction memory cell 5 has magnetic regions 55 and 135 that each have a length/width ratio in a range of 1 to 5 for a non-circular plan. When the aspect ratio of free and fixed regions 135 and 55 is less than five, magnetic moment vectors 85 and 105 in magnetic region 135 have a strong tendency to align anti-parallel solely from magnetostatic fringing fields. This magnetostatic coupling therefore allows the replacement of the anti-ferromagnetic coupling layer with a spacer layer that does not allow interlayer exchange. In the preferred embodiment, MRAM device 5 is circular in shape (generally in a cross-section parallel to substrate 10) so that there is no contribution to the switching field from shape anisotropy and also because it is easier to use photolithography processing to scale the device to smaller dimensions laterally. However, it will be understood that MRAM device 5 can have other shapes, such as square, rectangular, elliptical, or diamond but is illustrated as being circular for simplicity.

In a circular plan, a parameter that predominantly sets the switching field is the material's induced magnetic anisotropy, $H_k$. For typical materials such as NiFeCo, $H_k$ is only about 20 Oe, which is undesirable for MRAM device operation. If a N-layer structure is included in the free magnetic region, then the effective anisotropy and switching field, $H_{sw}$, is amplified depending on the sub-layer magnetic moment balance ratio of the individual sub-layer moments such that:

$$H_{sw} = \frac{(M_{85} + M_{105})}{(M_{85} - M_{105})} \cdot H_k,$$

where $M_{85}$, $M_{105}$ are the magnitude of the magnetic moment vectors in ferromagnetic layers 80 and 100, respectively.

Figure 2:
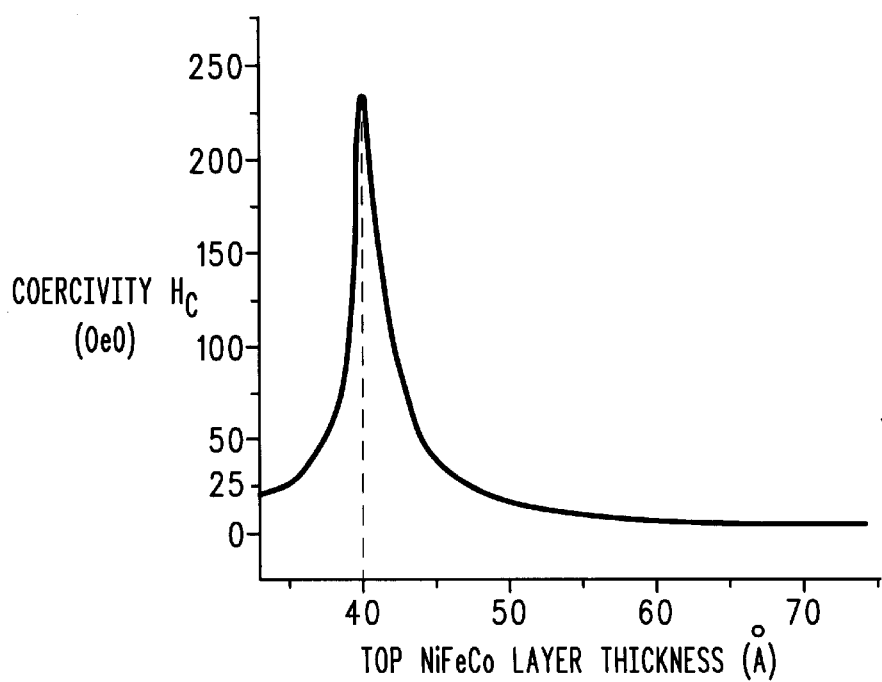
FIG. 2 is a graph illustrating the coercivity of a bulk free layer film verses the thickness of one ferromagnetic layer in a N-layer structure with the other layer held at a constant thickness of 40 Å.

Turn now to FIG. 2 in which a graph illustrates the effective switching field, $H_{sw}$, of a tri-layer structure verses thickness 101 of ferromagnetic layer 100. The graph of the data in FIG. 2 was generated from a bulk, unpatterned material film, and as such it is representative of the trend in $H_{sw}$ of circular bit patterns. Hence, FIG. 2 provides direct evidence of the amplification effect of an unbalanced synthetic anti-ferromagnetic structure.

In this particular example, thickness 86 of anti-ferromagnetic coupling spacer layer 90 is chosen to be 7 Å and thickness 81 of ferromagnetic layer 80 is chosen to be 40 Å. Also, in this example, anti-ferromagnetic spacer layer 90 includes Ru and ferromagnetic layers 80 and 100 include NiFeCo. As thickness 101 of ferromagnetic layer 100 is varied from approximately 30 Å to 75 Å, $H_{sw}$ varies dramatically in the range of approximately 35 Å to 45 Å. For optimal MRAM device operation, $H_{sw}$ should be approximately in the range between 50 Oe and 150 Oe. $H_{sw}$ can be set in this range by varying thickness 101 as illustrated. If thickness 101 is set at 40 Å, then $H_{sw}$ will be approximately 225 Oersteds, which is probably too high. If thickness 101 is set at around 43 Å, then $H_{sw}$ will be approximately 75 Oersteds, which is a more ideal value. The important point is that by adjusting the thicknesses, 81, 86, and 101, $H_{sw}$ can be adjusted to a desired value.

Thus, the scalable magnetoresistive memory device has a magnetic switching volume that can be controlled by varying N. By adjusting N, the magnetic switching volume can be increased as the MRAM device is scaled laterally to smaller dimensions. Consequently, the bit error rate due to thermal fluctuations is reduced. Also, $H_{sw}$ can be controlled by varying the thicknesses and/or materials of the ferromagnetic layers. By controlling $H_{sw}$, the switching field can be adjusted to a desired value sufficient for MRAM device operation as the device is scaled laterally to smaller dimensions.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same.

The invention claimed is:

1. A scalable magnetoresistive tunneling junction memory cell comprising:
   an electrically insulating material designed to form a magnetoresistive tunneling barrier;
   a first magnetic region positioned on one side of the electrically insulating material, the first magnetic region having a magnetic moment vector adjacent the electrically insulating material;
   a second magnetic region positioned on an opposite side of the electrically insulating material, the second magnetic region having a magnetic moment vector adjacent the insulating material and oriented in a position parallel or anti-parallel to the magnetic moment vector of the first magnetic region, the electrically insulating material and the first and second magnetic regions forming a magnetoresistive tunneling junction device, and
   at least one of the first and second magnetic regions including a synthetic anti-ferromagnetic layer material that has a magnetic switching volume, the synthetic anti-ferromagnetic layer material includes N ferromagnetic layers which are anti-ferromagnetically coupled, where N is an integer greater than or equal to two, and the magnetic switching volume is adjustable by changing N to maintain a sufficient energy barrier to switching for nonvolatile memory operation as the magnetoresistive memory element is scaled laterally to smaller dimensions.

2. A scalable magnetoresistive tunneling junction memory cell as claimed in claim 1 wherein the magnetic switching volume is adjusted by increasing N such that the volume remains substantially constant or increases as the magnetoresistive memory element is scaled laterally to smaller dimensions.

3. A scalable magnetoresistive tunneling junction memory cell as claimed in claim 1 wherein a sub-layer magnetic moment fractional balance ratio of the one of the first and second magnetic regions remains constant as the magnetoresistive memory element is scaled laterally to smaller dimensions.

4. A scalable magnetoresistive tunneling junction memory cell comprising:
   an electrically insulating material designed to form a magnetoresistive tunneling barrier;
   a first magnetic region positioned on one side of the electrically insulating material, the first magnetic region having a magnetic moment vector adjacent the electrically insulating material;
   a second magnetic region positioned on an opposite side of the electrically insulating material, the second magnetic region having a magnetic moment vector adjacent the insulating material and oriented in a position parallel or anti-parallel to the magnetic moment vector of the first magnetic region, the electrically insulating material and the first and second magnetic regions forming a magnetoresistive tunneling junction device, and
   at least one of the first and second magnetic regions including N ferromagnetic layers which are anti-ferromagnetically coupled, where N is an integer number greater than or equal to two, and has a sub-layer magnetic moment fractional balance ratio and the switching field of at least the one of the first and second magnetic regions is adjusted by changing the sub-layer magnetic moment fractional balance ratio such that the magnetoresistive memory element is scalable laterally to smaller dimensions.

5. A scalable magnetoresistive tunneling junction memory cell comprising:
   a first magnetic region having a resultant magnetic moment vector fixed in a preferred direction in the absence of an applied magnetic field;
   an electrically insulating material positioned on the first magnetic region to form a magnetoresistive tunneling barrier; and
   a second magnetic region positioned on the insulating material and having a resultant magnetic moment vector switchable between positions parallel and anti-parallel to the resultant magnetic moment vector of the first magnetic region, the electrically insulating material and the first and second magnetic regions forming a magnetoresistive tunneling junction device, and at least one of the first and second magnetic regions include N ferromagnetic layers which are anti-ferromagnetically coupled, where N is an integer greater than or equal to two, and the at least one of the first and second magnetic regions including a sub-layer magnetic moment fractional balance ratio designed to set a switching field.

6. A scalable magnetoresistive tunneling junction memory cell as claimed in claim 5 wherein the first and second magnetic regions at least the one of the first and second magnetic regions has a length/width ratio in a range of 1 to 5.

7. A scalable magnetoresistive tunneling junction memory cell as claimed in claim 5 wherein the N ferromagnetic layers are anti-ferromagnetically coupled by sandwiching a layer of anti-ferromagnetic coupling material between each adjacent pair of ferromagnetic layers.

8. A scalable magnetoresistive tunneling junction memory cell as claimed in claim 7 wherein at least one layer of the anti-ferromagnetic coupling material includes one of Ru, Re, Os, Cr, Rh, and Cu and combinations thereof.

9. A scalable magnetoresistive tunneling junction memory cell as claimed in claim 5 wherein at least one of the N ferromagnetic layers includes one of Ni, Fe, Mn, Co, and combinations thereof.

10. A scalable magnetoresistive tunneling junction memory cell as claimed in claim 5 wherein the first and second magnetic regions each have a plan that is circular.

11. A scalable magnetoresistive tunneling junction memory cell as claimed in claim 5 wherein at least one of the first and second magnetic regions has a magnetic switching volume that remains substantially constant or increases as the device is scaled laterally to smaller dimensions.

12. A scalable magnetoresistive tunneling junction memory cell as claimed in claim 5 wherein the sub-layer magnetic moment fractional balance ratio of at least one of the first and second magnetic regions are chosen so that a magnetic field needed to switch the switchable resultant magnetic moment vector remains substantially constant as the device is scaled laterally to smaller dimensions.

13. A scalable magnetoresistive tunneling junction memory cell comprising:

a substrate;

an anti-ferromagnetic material supported on the substrate;

a fixed magnetic region positioned on the anti-ferromagnetic material which includes a synthetic anti-ferromagnetic layer material, having a resultant magnetic moment vector which is fixed in a preferred direction in the absence of an applied magnetic field;

an electrically insulating layer positioned on the fixed magnetic region; and a free magnetic region positioned on the electrically insulating layer to form a magnetoresistive tunneling junction device in cooperation with the electrically insulating layer and the fixed magnetic region, the free magnetic region including a synthetic anti-ferromagnetic layer material that includes N layers of a ferromagnetic material, where N is an integer number greater than or equal to two, and wherein each layer of the N layers of the ferromagnetic material has a magnetic moment vector where the magnetic moment vectors of each adjacent layer of the N layers of the ferromagnetic material are oriented anti-parallel such that they are anti-ferromagnetically coupled, and a magnetic switching volume of the free magnetic region that is scalable by increasing N such that the volume remains substantially constant or increases to maintain a sufficient energy barrier to switching for nonvolatile memory operation and a moment fractional balance ratio of the free magnetic region that remains substantially constant as the scalable magnetoresistive memory element is scaled laterally to smaller dimensions.

14. A scalable magnetoresistive tunneling junction memory cell as claimed in claim 13 wherein the free and fixed magnetic regions each have a length/width ratio in a range of 1 to 5.

15. A scalable magnetoresistive tunneling junction memory cell as claimed in claim 13 wherein the free and fixed magnetic regions each have a plan that is circular.

16. A scalable magnetoresistive tunneling junction memory cell as claimed in claim 13 wherein each layer of the N layers of ferromagnetic material is anti-ferromagnetically coupled by sandwiching a layer of an anti-ferromagnetic coupling material between pairs of adjacent layers of the ferromagnetic material.

17. A scalable magnetoresistive tunneling junction memory cell as claimed in claim 16 wherein at least one layer of the anti-ferromagnetic coupling material includes one of Ru, Re, Os, Cr, Rh, and Cu and combinations thereof.

18. A scalable magnetoresistive tunneling junction memory cell as claimed in claim 16 wherein at least one layer of the anti-ferromagnetic coupling material has a thickness that is between 4 Å and 30 Å.

19. A scalable magnetoresistive tunneling junction memory cell as claimed in claim 13 wherein at least one of the N layers of the ferromagnetic material includes one of Ni, Fe, Mn, Co, and combinations thereof.

20. A scalable magnetoresistive tunneling junction memory cell as claimed in claim 13 wherein at least one of the N has a thickness that is between 10 Å and 100 Å.

21. A scalable magnetoresistive tunneling junction memory cell as claimed in claim 13 wherein the free magnetic region has a magnetic switching volume that remains substantially constant or increases as the free magnetic region is scaled laterally to smaller dimensions maintaining a sufficient energy barrier to switching for nonvolatile operation.

* * * * *

UNITED STATES PATENT AND TRADEMARK OFFICE
CERTIFICATE OF CORRECTION

PATENT NO. : 6,531,723 B1 Page 1 of 1
DATED : March 11, 2003
INVENTOR(S) : Engel et al.

It is certified that error appears in the above-identified patent and that said Letters Patent is hereby corrected as shown below:

Column 1,
Line 3, add as a new first paragraph the following paragraph:
   -- This invention was made with Government support under Agreement No. MDA972-96-3-0016 awarded by DARPA. The Government has certain rights in the invention. --

Signed and Sealed this

Twenty-eighth Day of October, 2003

JAMES E. ROGAN
*Director of the United States Patent and Trademark Office*